(12) United States Patent
Lo

(10) Patent No.: US 8,166,433 B2
(45) Date of Patent: Apr. 24, 2012

(54) METHOD TO INSPECT FLOATING CONNECTION AND FLOATING NET OF INTEGRATED CIRCUIT

(75) Inventor: Yu-Lan Lo, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 340 days.

(21) Appl. No.: 12/493,425

(22) Filed: Jun. 29, 2009

(65) Prior Publication Data
US 2010/0005432 A1    Jan. 7, 2010

(30) Foreign Application Priority Data
Jul. 1, 2008    (TW) .............................. 97124707 A

(51) Int. Cl.
*G06F 17/50* (2006.01)
*G01R 21/00* (2006.01)
*G01R 27/28* (2006.01)
*G01R 31/28* (2006.01)

(52) U.S. Cl. ........ 716/112; 716/104; 716/106; 716/134; 716/136; 702/59; 702/117; 703/16; 714/33; 714/41

(58) Field of Classification Search .................. 716/136, 716/104, 106, 112, 134; 714/32–36, 41; 702/57–59, 117–126; 703/14–16
See application file for complete search history.

(56) References Cited

U.S. PATENT DOCUMENTS

| 6,090,149 A * | 7/2000 | Nair et al. ........................ 703/14 |
| 6,542,860 B1 * | 4/2003 | McBride ......................... 703/14 |
| 7,145,344 B2 * | 12/2006 | Mark et al. ..................... 324/525 |
| 7,363,560 B1 * | 4/2008 | Mark et al. ..................... 714/725 |
| 7,733,099 B2 * | 6/2010 | Bae et al. ................... 324/754.22 |
| 2005/0149806 A1 * | 7/2005 | Matsuura ....................... 714/741 |
| 2007/0296447 A1 * | 12/2007 | Bae et al. ...................... 324/765 |

\* cited by examiner

*Primary Examiner* — Phallaka Kik
*Assistant Examiner* — Mohammed Alam
(74) *Attorney, Agent, or Firm* — Thomas, Kayden, Horstemeyer & Risley, LLP

(57) ABSTRACT

A floating net inspection method includes: providing a netlist which describes a circuit structure of an application circuit, the application circuit including a plurality of transistors; coupling a power supply port and a signal input port of the application circuit to voltage sources, respectively; generating test voltages respectively through the voltage sources, such that the test voltages are applied to the transistors, the test voltages being larger than a reference voltage; and determining whether a connecting node of one of the transistors is floating on the basis of whether a voltage of the connecting node is larger than the reference voltage.

14 Claims, 3 Drawing Sheets

METHOD TO INSPECT FLOATING CONNECTION AND FLOATING NET OF INTEGRATED CIRCUIT

CROSS-REFERENCE TO RELATED APPLICATION

This application claims priority from Taiwanese Application No. 097124707, filed on Jul. 1, 2008, incorporated by reference herein in its entirety.

BACKGROUND OF THE INVENTION

1. Field of the Invention

The present invention relates to a circuit design inspection method, more particularly to a floating net inspection method.

2. Description of the Related Art

A netlist may be used when designing an integrated circuit, and is a file that describes in words a circuit structure of an application circuit. In order to make sure that the application circuit described by a netlist is operating normally, it is necessary to inspect for the presence of floating nets in the application circuit.

One way in which the presence of floating nets in an application circuit may be checked involves using a program included in an electronic design automation (EDA) tool. In particular, through use of such an EDA tool, a netlist of an application circuit is inspected to determine whether a gate of each metal-oxide semiconductor field-effect transistor (MOSFET) in the application circuit is connected to an element. If the gate is not connected to an element, the gate of the MOSFET is deemed to be floating. Although such a method allows for inspection prior to layout, it is not completely accurate. For example, when the gate of one of the MOSFETs is only connected to one terminal of a capacitor, the gate of the particular MOSFET is in a floating state, but is not determined to be floating using this conventional method. As another example, when the gate of one of the MOSFETs is only connected to one terminal of a resistor, although the determination of whether the gate of the particular MOSFET is floating depends on whether the other terminal of the resistor is floating, the conventional method will determine that the gate of the MOSFET is not floating regardless of the connection state of the other terminal of the resistor.

SUMMARY OF THE INVENTION

Therefore, an object of this invention is to provide a floating net inspection method, which allows for inspection at an early stage of design, and for inspection that may be performed quickly and accurately.

According to one aspect of this invention, a floating net inspection method comprises: providing a netlist which describes a circuit structure of an application circuit, the application circuit including a plurality of transistors, coupling a power supply port and a signal input port of the application circuit to voltage sources, respectively; generating test voltages respectively through the voltage sources, such that the test voltages are applied to the transistors, the test voltages being larger than a reference voltage; and determining whether a connecting node of one of the transistors is floating on the basis of whether a voltage of the connecting node is larger than the reference voltage.

According to another aspect of this invention, a floating net inspection method comprises: providing a netlist which describes a circuit structure of an application circuit, the application circuit including a plurality of transistors; coupling a power supply port and a signal input port of the application circuit to voltage sources, respectively; generating test voltages respectively through the voltage sources, such that the test voltages are applied to the transistors; and determining whether a connecting node of one of the transistors is floating on the basis of whether a voltage of the connecting node is substantially identical to one of the test voltages.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
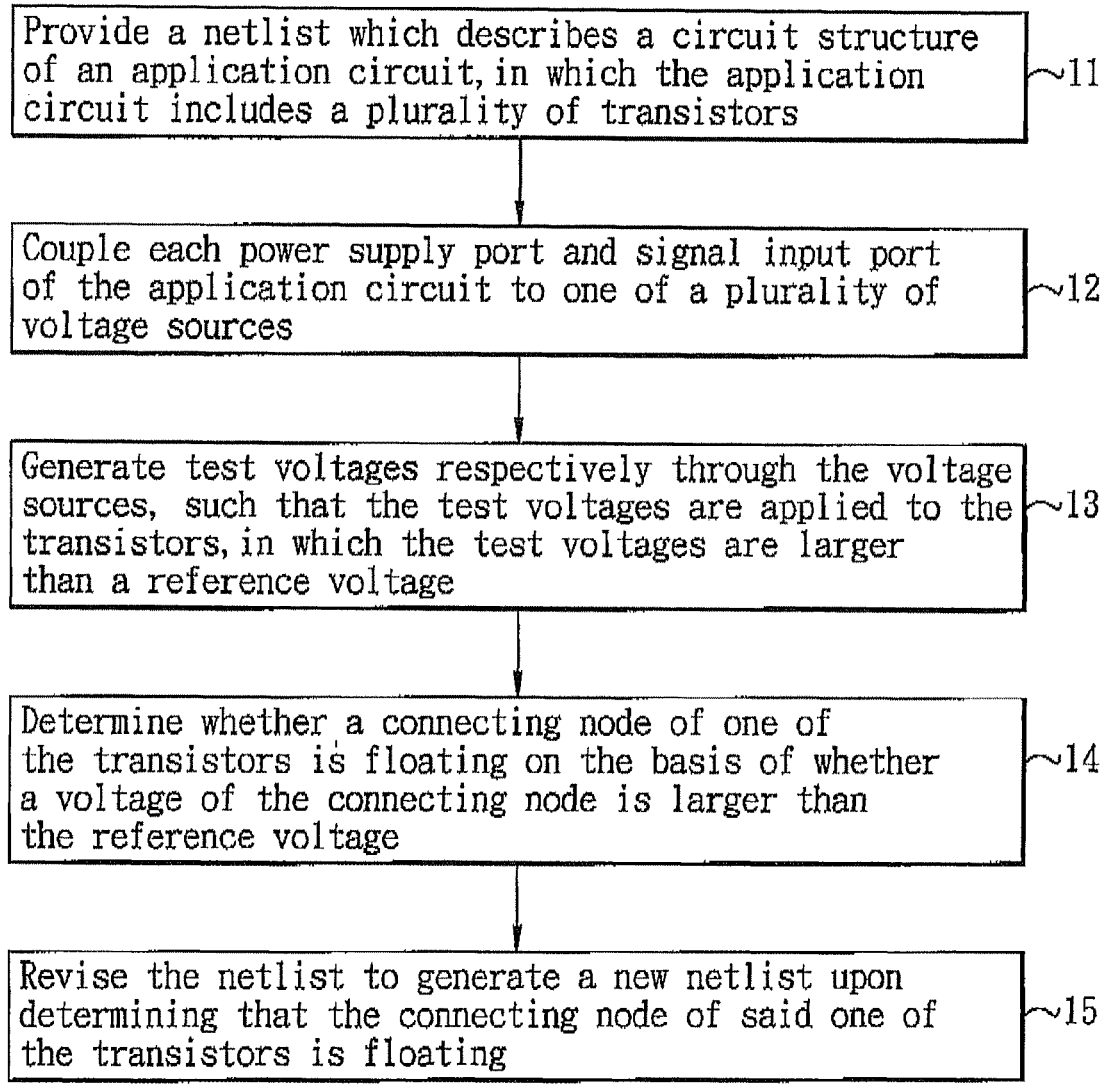
FIG. 1 is a flowchart of a floating net inspection method according to a first preferred embodiment of the present invention.

A floating net inspection method according to a first preferred embodiment of the present invention is described below with reference to FIG. 1.

First, in step 11, a netlist is provided which describes a circuit structure of an application circuit. The application circuit includes a plurality of transistors.

Next, in step 12, each power supply port and signal input port of the application circuit is coupled to one of a plurality of voltage sources.

In step 13, test voltages are generated respectively by the voltage sources, such that the test voltages are applied to the transistors. The test voltages are larger than a reference voltage in this embodiment.

In step 14, it is determined whether a connecting node of one of the transistors is floating on the basis of whether a voltage of the connecting node is larger than the reference voltage.

In step 15, the netlist is revised to generate a new netlist upon determining that the connecting node of said one of the transistors is floating.

As is appreciated by one having ordinary skill in the art, a computing device may be used to perform the functionality described herein.

It is evident from the above that the first preferred embodiment of the present invention provides a netlist, and the netlist describes a circuit structure of an application circuit, such as a network communication controller, a display controller, an analog-to-digital converter, a digital-to-analog converter, or a phase lock loop (PLL) application circuit. Regardless of whether the application circuit is an analog circuit or a digital circuit, this embodiment may be used to perform inspection of the presence of floating nets in the application circuit.

Moreover, each power supply port and signal input port of the application circuit is coupled to a voltage is source, and each voltage source generates a test voltage which is applied to the application circuit. It is to be noted that the test voltages may be the same (for example, all 5V such that testing is performed with all power supply and signal input ports receiving 5V), or the test voltages may be partially the same (for example, 5V and 3.3V such that testing is performed in a state where some of the power supply ports receive 5V and other power supply ports receive 3.3V, and some of the signal input ports receive 5V and other signal input ports receive 3.3V). In addition, the test voltages are larger than the reference voltage in this embodiment. The reference voltage may be determined by the circuit designer, and may be, for example, 0V, 3.3V, or 5V. Of course, the test voltages and the reference voltage of this embodiment are not limited to 5V, 3.3V, or 0V, and they may be various other voltages.

After the test voltages are applied to the transistors, it is determined whether a connecting node of one of the transistors is floating on the basis of whether a voltage of the connecting node is larger than the reference voltage. The connecting node may be a gate, a drain, or a source of said one of the transistors. In one embodiment, if the voltage of the connecting node of said one of the transistors is larger than the reference voltage, this is interpreted to mean that the connecting node is not floating, while if the voltage of the connecting node of said one of the transistors is smaller than or equal to the reference voltage, this is interpreted to mean that the connecting node is floating. When it is determined that the connecting node is floating, it is necessary to revise the netlist to generate a new netlist, after which inspection and revision are repeated until no more floating nets are present in the application circuit.

Figure 2:
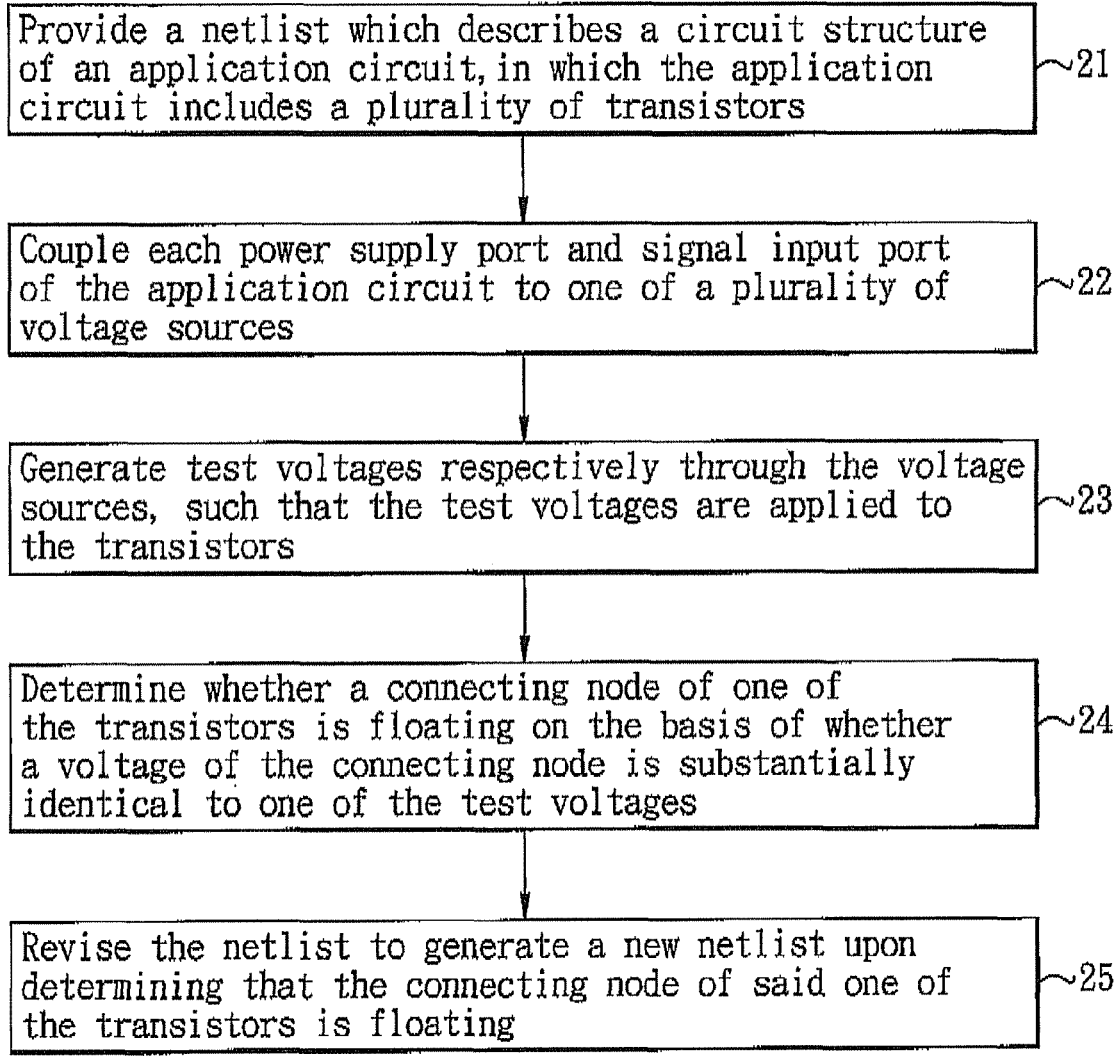
FIG. 2 is a flowchart of a floating net inspection method according to a second preferred embodiment of the present invention.

A floating net inspection method according to a second preferred embodiment of the present invention will now be described with reference to FIG. 2.

In step 21, a netlist is provided which describes a circuit structure of an application circuit. The application circuit includes a plurality of transistors.

Next, in step 22, each power supply port and signal input port of the application circuit is coupled to one of a plurality of voltage sources.

In step 23, test voltages are generated respectively by the voltage sources, such that the test voltages are applied to the transistors.

In step 24, it is determined whether a connecting node of one of the transistors is floating on the basis of whether a voltage of the connecting node is substantially identical to one of the test voltages.

In step 25, the netlist is revised to generate a new netlist upon determining that the connecting node of said one of the transistors is floating.

As is evident from the above, the second preferred embodiment differs from the first preferred embodiment in the manner in which the test voltages are used to determine whether the connecting nodes of the transistors are floating. In particular, in the second preferred embodiment, when the test voltages are applied to the transistors, it is determined whether the connecting node of one of the transistors is floating on the basis of whether a voltage of the connecting node (e.g., the voltage of the gate, drain, or source of said one of the transistors) is substantially identical to one of the test voltages. In one embodiment, if the voltage of the connecting node of said one of the transistors is not substantially identical to one of the test voltages, it is determined that the connecting node is floating, while if the voltage of the connecting node of said one of the transistors is substantially identical to one of the test voltages, it is determined that the connecting node is not floating. Other aspects of the second preferred embodiment are identical to the first preferred embodiment.

Figure 3:
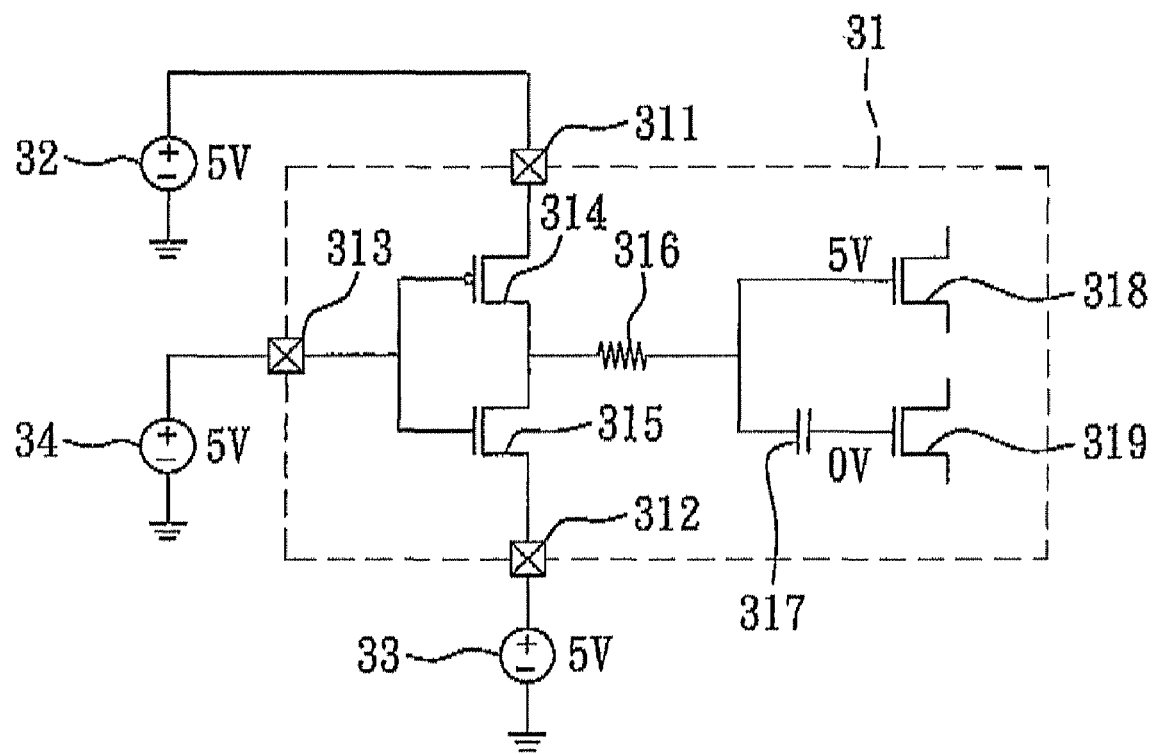
FIG. 3 is a schematic circuit diagram of an exemplary application circuit which is described by a netlist and inspected by the preferred embodiments to determine whether any floating connecting nodes are present therein.

FIG. 3 is a schematic circuit diagram of an exemplary application circuit 31 which is described by a netlist and inspected by the above embodiments to determine whether any floating connecting nodes are present therein. For this example, the application circuit 31 includes four transistors 314, 315, 318, 319, two power supply ports 311, 312, a signal input port 313, a resistor 316, and a capacitor 317. The components of the application circuit 31 are coupled as shown in FIG. 3.

In order to inspect the application circuit 31 to determine whether there is a floating connecting node present therein, the power supply ports 311, 312 and the signal input port 313 are connected respectively to voltage sources 32, 33, 34 which each supply a test voltage of 5V. In addition, the test voltages of 5V supplied by the voltage sources 32, 33, 34 are delivered into the application circuit 31 through the transistors 314, 315 and the resistor 316, but are unable to be transmitted into the application circuit 31 via the capacitor 317. As a result, the voltage of the gate of the transistor 318 is 5V, while the voltage of the gate of the transistor 319 is 0V. The voltage of each connecting node is inspected to determine if it is substantially identical to the test voltages (5V), or larger than a reference voltage (e.g., 3.3V) which is set by the circuit designer. In the example of FIG. 3, the voltage of the gate of the transistor 318 is 5V, and is substantially identical to the test voltages of 5V and larger than the pre-set reference voltage of 3.3V. In contrast, the voltage of the gate of the transistor 319 is 0V, which is neither identical to the test voltages of 5V nor larger than the reference voltage of 3.3V. Therefore, it may be determined that the gate of the transistor 318 is not floating, while the gate of the transistor 319 is floating.

It is to be noted that in the preferred embodiments, the test voltages provided by the voltage sources 32, 33, 34 do not all need to be the same. For example, the voltage sources 32, 33 each may provide a test voltage of 5V, and the voltage sources 4 may provide a test voltage of 6V. Moreover, the application circuit 31 of FIG. 3 is but one example of what may be described by the netlist provided by the preferred embodiments, and many different circuit structures may be described by the netlist provided by the preferred embodiments. For example, the application circuit described by the netlist may be an analog circuit or a digital circuit, and is not limited to the circuit structure of the application circuit 31 shown in FIG. 3.

From the aforementioned, the present invention uses a netlist to perform inspection for floating nets. Therefore, inspection may be performed at an early stage of design. Furthermore, by performing inspection through the application of voltages, inspection for floating nets may be performed quickly and accurately.

With this invention thus explained, it is apparent that numerous modifications and variations can be made without departing from the scope and spirit of this invention. It is therefore intended that this invention be limited only as indicated by the appended claims.

What is claimed is:

1. A floating net inspection method comprising:
providing, in a computing device, a netlist which describes a circuit structure of an application circuit, the application circuit including a plurality of transistors;
coupling, in the computing device, a power supply port and a signal input port of the application circuit to voltage sources, respectively;
generating, in the computing device, test voltages respectively through the voltage sources, such that the test voltages are applied to the transistors, wherein the test voltages are larger than a reference voltage; and
determining, in the computing device, whether a connecting node of one of the transistors is floating on the basis of whether a voltage of the connecting node is larger than the reference voltage.

2. The floating net inspection method of claim 1, further comprising revising the netlist to generate a new netlist upon determining that the connecting node of said one of the transistors is floating.

3. The floating net inspection method of claim 1, wherein the connecting node is a gate of said one of the transistors.

4. The floating net inspection method of claim 1, wherein some of the test voltages are substantially identical to each other.

5. The floating net inspection method of claim 1, wherein all the test voltages are substantially identical to each other.

6. The floating net inspection method of claim 1, wherein the application circuit is a digital circuit.

7. The floating net inspection method of claim 1, wherein the application circuit is an analog circuit.

8. A floating net inspection method comprising:
providing, in a computing device, a netlist which describes a circuit structure of an application circuit, the application circuit including a plurality of transistors;
coupling, in the computing device, a power supply port and a signal input port of the application circuit to voltage sources, respectively;
generating, in the computing device, test voltages respectively through the voltage sources, such that the test voltages are applied to the transistors; and
determining, in the computing device, whether a connecting node of one of the transistors is floating on the basis of whether a voltage of the connecting node is substantially identical to one of the test voltages.

9. The floating net inspection method of claim 8, further comprising revising the netlist to generate a new netlist upon determining that the connecting node of said one of the transistors is floating.

10. The floating net inspection method of claim 8, wherein the connecting node is a gate of said one of the transistors.

11. The floating net inspection method of claim 8, wherein some of the test voltages are substantially identical to each other.

12. The floating net inspection method of claim 8, wherein all the test voltages are substantially identical to each other.

13. The floating net inspection method of claim 8, wherein the application circuit is a digital circuit.

14. The floating net inspection method of claim 8, wherein the application circuit is an analog circuit.

* * * * *